(12) United States Patent
Oh et al.

(10) Patent No.: US 7,999,274 B2
(45) Date of Patent: Aug. 16, 2011

(54) WHITE LIGHT EMITTING DEVICE

(75) Inventors: Jeong Tak Oh, Gyunggi-do (KR); Yong Chun Kim, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 88 days.

(21) Appl. No.: 12/618,269

(22) Filed: Nov. 13, 2009

(65) Prior Publication Data

US 2010/0163899 A1    Jul. 1, 2010

(30) Foreign Application Priority Data

Dec. 26, 2008  (KR) .................. 10-2008-0134775

(51) Int. Cl.
*H01L 33/00* (2010.01)
(52) U.S. Cl. .............. 257/96; 257/14; 257/79; 257/100; 257/E33.012; 257/E33.023; 257/E33.059; 257/E33.061
(58) Field of Classification Search ............ 257/14, 257/79, 98, 100, E33.012, E33.023, E33.059, 257/E33.061
See application file for complete search history.

(56) References Cited

U.S. PATENT DOCUMENTS

| 7,514,722 B2 * | 4/2009 | Kawaguchi et al. ............ 257/98 |
| 7,663,140 B2 * | 2/2010 | Yamazaki et al. .............. 257/40 |
| 7,737,457 B2 * | 6/2010 | Kolodin et al. ................. 257/98 |
| 7,854,859 B2 * | 12/2010 | Kameshima et al. ... 252/301.4 F |
| 2004/0183088 A1 * | 9/2004 | DenBaars et al. ............ 257/102 |
| 2006/0006375 A1 * | 1/2006 | Ou et al. ......................... 257/14 |
| 2008/0128679 A1 * | 6/2008 | Tian et al. ....................... 257/14 |
| 2009/0212314 A1 * | 8/2009 | Im et al. .......................... 257/98 |
| 2010/0283381 A1 * | 11/2010 | Takahashi et al. ............ 313/503 |
| 2011/0053299 A1 * | 3/2011 | Shimieu et al. ................. 438/27 |

FOREIGN PATENT DOCUMENTS

KR    10-2008-0026529 A    3/2008

* cited by examiner

*Primary Examiner* — Victor Mandala
(74) *Attorney, Agent, or Firm* — McDermott Will & Emery LLP

(57) ABSTRACT

A white light emitting device is disclosed. The white light emitting device includes a blue light emitting diode (LED) including a plurality of active layers generating different peak wavelengths, and phosphors emitting yellow light when excited by light emitted from the blue LED. The white light emitting device ensures enhanced excitation efficiency of the phosphors, and high luminance.

10 Claims, 3 Drawing Sheets

WHITE LIGHT EMITTING DEVICE

CROSS-REFERENCE TO RELATED APPLICATIONS

This application claims the priority of Korean Patent Application No. 10-2008-0134775 filed on Dec. 26, 2008, in the Korean Intellectual Property Office, the disclosure of which is incorporated herein by reference.

BACKGROUND OF THE INVENTION

1. Field of the Invention

The present invention relates to a white light emitting device, and more particularly, to a white light emitting device, which can achieve high emission efficiency by use of a blue light emitting diode (LED) having a plurality of active layers that generate different center wavelengths.

2. Description of the Related Art

Recently, much attention has been drawn to light emitting diodes (LEDs) as light sources for backlight units (BLUs) employed in liquid crystal displays (LCDs) for lap top computers, monitors, mobile phones, TVs and the like. Cold cathode fluorescent lamps (CCFLs) have been in use as white light sources for BLUs. However, of late, white light source modules employing LEDs have captured attention due to their advantages such as better color representation and lower power consumption.

To implement a white LED light source, a white light emitting device may employ LEDs of the three primary colors, blue (B), green (G) and red (R) in one package. Such a white light emitting device may ensure relatively high color representation and the overall control of output light by adjusting the quantity of light from the R, G and B LEDs. However, the R, G and B LEDs, spaced apart from each other, may undermine color uniformity. Particularly, the R LED is sensitive to the temperature and has a light efficiency which is susceptible to degradation by heat, resulting in the unstable uniformity of white light. Moreover, to produce white light, at least one set of R, G, and B LED chips is required in a unit area. This entails a complicated circuit configuration to drive and control the LED of each color, thus leading to higher manufacturing costs for packages.

Alternatively, a white light emitting device may be implemented by applying phosphors, emitting red, blue and green light, to ultraviolet (UV) LED chips at predetermined ratios. However, this white LED fails to produce high-luminance white light because the emission efficiency of phosphors emitting red light is low in spite of the high excitation energy of UV light emitted from the UV LED chip. Moreover, the three colors of the phosphors, which are mixed at a specific composition ratio, need to be properly matched so as to produce white light. This requires sensitive and complicated processes in preparing the phosphors.

Alternatively, a white light emitting device may also be implemented by using the combination of blue LEDs and yellow phosphors excited by blue light from the blue LEDs. This white light emitting device ensures simple circuit configuration and low costs. FIG. 1 illustrates the emission spectrum of a related art white LED manufactured by using the combination of GaN-based blue LEDs and YAG-based yellow phosphors. Referring to FIG. 1, the intensity of light is high in both the blue and yellow wavelength regions. However, the wavelength of the LED in a short wavelength range, which does not match the excitation wavelength of the phosphors, undermines the excitation efficiency of the phosphors, thus lowering the luminance level thereof.

Therefore, low-cost, high quality white LEDs are required, which can achieve high and stable color uniformity and enhanced color reproducibility.

SUMMARY OF THE INVENTION

An aspect of the present invention provides a white light emitting device which allows the excitation efficiency of phosphors to increase and achieves a high luminance characteristic, by using a blue light emitting diode (LED) generating different peak wavelengths.

According to an aspect of the present invention, there is provided a white light emitting device including: a blue light emitting diode (LED) including a plurality of active layers generating different peak wavelengths; and phosphors emitting yellow light when excited by light emitted from the blue LED.

The blue LED may be a semiconductor light emitting device having a composition represented by $Al_xIn_yGa_{(1-x-y)}N$.

The plurality of active layers each may include quantum well layers of $In_xGa_{(1-x)}N$ where $0<x<1$, and quantum barrier layers of GaN. The quantum well layers may have different In compositions to generate different peak wavelengths.

The plurality of active layers each may include quantum well layers of $In_xGa_{(1-x)}N$ where $0<x<1$, and quantum barrier layers of GaN. The quantum well layers may have different thicknesses to generate different peak wavelengths.

The different peak wavelengths may have an interval of 20 nm to 50 nm therebetween.

The blue LED may emit a wavelength ranging from 400 nm to 420 nm and a wavelength ranging from 450 nm to 470 nm as the different peak wavelengths.

The blue LED may emit a wavelength ranging from 400 nm to 420 nm, a wavelength ranging from 420 nm to 440 nm, and a wavelength ranging from 440 nm to 460 nm as the different peak wavelengths.

The phosphors may be silicate-based phosphors.

The blue LED may be mounted directly on a circuit board, the phosphors may be included in a resin encapsulation part, and the resin encapsulation part may encapsulate the blue LED.

The blue LED may be mounted in a package body including a reflective cup, the package body may be mounted on a circuit board, the phosphors may be included in a resin encapsulation part, and the resin encapsulation part may encapsulate the blue LED.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
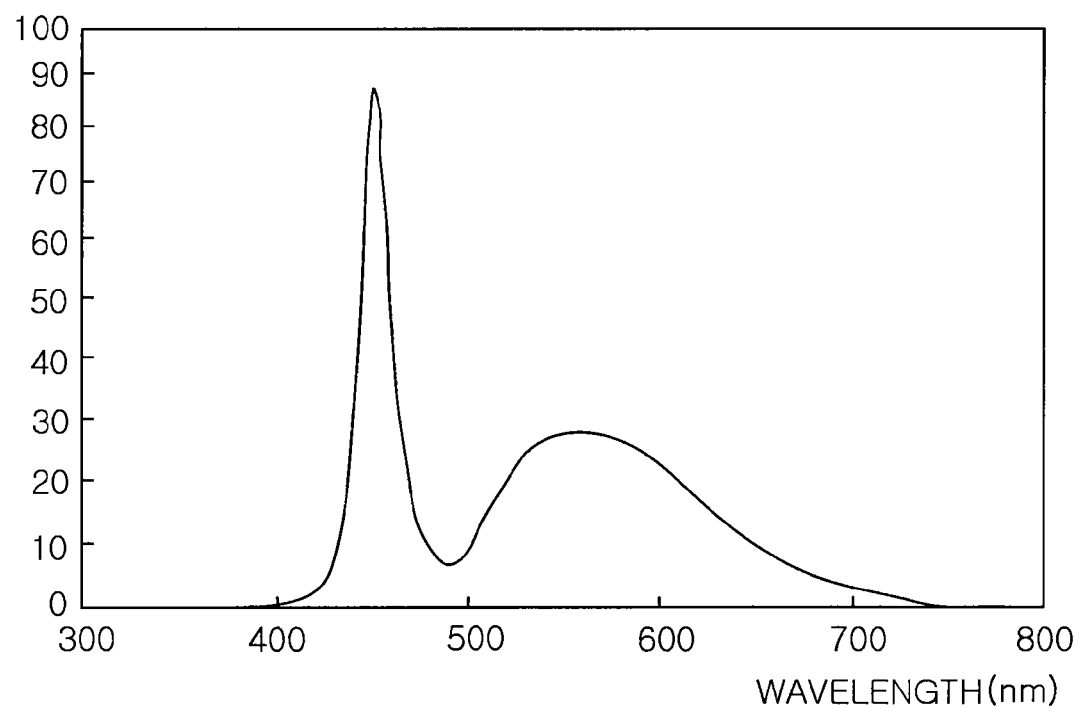
FIG. 1 illustrates the emission spectrum of a related art white light emitting device manufactured using the combination of a GaN-based blue LED and yellow phosphors.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements, and thus their description will be omitted.

Figure 2:
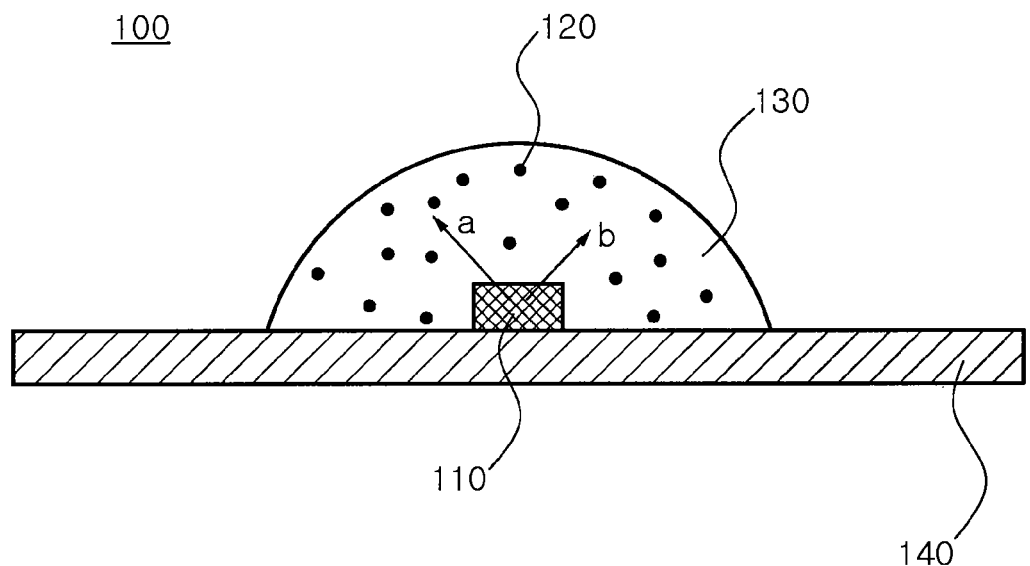
FIG. 2 is a cross-sectional view of a white light emitting device according to an exemplary embodiment of the present invention.

FIG. 2 is a cross-sectional view of a white light emitting device according to an exemplary embodiment of the present invention.

Referring to FIG. 2, a white light emitting device 100, according to this embodiment, includes a circuit board 140, a blue light emitting diode (LED) 110 disposed on the circuit board 140 and including a plurality of active layers generating different peak wavelengths, and phosphors 120 excited by light emitted from the blue LED 110 to emit yellow light.

Connection patterns (not shown), such as electrode patterns or circuit patterns, are disposed on the circuit board 140. These connection patterns are connected to the blue LED 110 by wire bonding or flip chip bonding, for example. Yellow phosphors 120 are dispersed in a hemispherical resin encapsulation part 130 that encapsulates the blue LED 110. The resin encapsulation part 130 contains the yellow phosphors 120 to convert the wavelength of blue light, protect the blue LED 110 and its connection portion (e.g., wire bonding), and serve as a kind of lens.

A plurality of white light source units, each of which includes the blue LED 110 and the yellow phosphors 120, may be arranged on the circuit board 140. By arranging the plurality of white light source units, a surface light source or a line light source of a desired size (area or length) may be formed.

The blue LED 110 includes a plurality of active layers generating different peak wavelengths in the blue wavelength range.

The blue LED 110 may be a nitride semiconductor light emitting device having a composition represented by $Al_xIn_yGa_{(1-x-y)}N$ where $0 \leq x \leq 1$, $0 \leq y \leq 1$, $0 \leq x+y \leq 1$. The blue LED 110 includes an n-type nitride semiconductor layer, a p-type nitride semiconductor layer, and a plurality of active layers disposed between the n-type and p-type nitride semiconductor layers. The active layers generate light due to the recombination of electrons generated in the n-type semiconductor layer and holes generated in the p-type nitride semiconductor layer, and have a multiple quantum well structure. The wavelength of light being emitted may be controlled by adjusting the heights of quantum barrier layers, the thicknesses of quantum well layers and the compositions of the active layers.

In more detail, the plurality of active layers each include quantum well layers formed of $In_xGa_{(1-x)}N$ where $0<x<1$, and quantum barrier layers formed of GaN. The quantum well layers may have different In compositions, so that two or more different peak wavelengths can be generated. The peak wavelengths may range from 400 nm to 490 nm.

The plurality of active layers each include quantum well layers formed of $In_xGa_{(1-x)}N$ where $0<x<1$, and quantum barrier layers formed of GaN. The quantum well layers may have different thicknesses, so that different peak wavelengths can be generated. The thicknesses of the quantum well layers may range from 2 nm to 5 nm.

In addition to the nitride-based semiconductor materials, any other known semiconductor materials are applicable to the present invention.

According to this embodiment, the blue LED 110 emits two different peak wavelengths 'a' and 'b' in the blue wavelength range, and the yellow phosphors 120 are excited by the blue light emitted from the blue LED 110 to emit yellow light. The blue light from the blue LED 110 and the yellow light from the yellow phosphors are mixed to produce white light.

The different peak wavelengths emitted from the blue LED 110 are not limited specifically, provided that those peak wavelengths fall within the blue wavelength range. The peak wavelengths may be selected properly according to the properties of the phosphors within the range that ensures the enhancement of the excitation efficiency of the phosphors.

In general, yellow phosphors have high excitation efficiency by light having short wavelengths. However, the short wavelengths in the blue wavelength range provide low visual sensitivity. For this reason, the use of blue LEDs emitting short wavelengths may increase the excitation efficiency of phosphors but undesirably degrade the luminance level.

The blue LED 110, according to this embodiment, emits a short wavelength that ensures high excitation efficiency in the phosphors 120, and a long wavelength that ensures high visual sensitivity. Accordingly, the excitation efficiency of the phosphors 120 can be enhanced, and a high luminous characteristic can be achieved.

In more detail, a short wavelength that ensures high excitation efficiency of the phosphors is emitted as well as a long wavelength that ensures higher visual sensitivity than the short wavelength. For example, the different peak wavelengths may have an interval of 20 nm to 50 nm therebetween.

In the case of the emission of two different peak wavelengths, a wavelength ranging from 400 nm to 420 nm, and a wavelength ranging from 450 nm to 470 nm may be emitted, although not limited thereto.

In this embodiment, the blue LED is described, which emits blue light having two different peak wavelengths. However, the blue LED maybe configured to emit blue light having more than two different peak wavelengths. For example, the blue LED may emit a wavelength ranging from 400 nm to 420 nm, a wavelength ranging from 420 nm to 440 nm, and a wavelength ranging from 440 nm to 460 nm, although not limited thereto.

The yellow phosphors 120 are excited by blue light emitted from the blue LED 110 to produce yellow light. The yellow phosphors 120 may utilize silicate-based phosphors.

The silicate-based phosphors have high excitation efficiency when excited by a relatively short wavelength within the blue wavelength range. However, blue light with a short wavelength provides low visual sensitivity, undermining luminance levels. By using blue light having both short and long wavelengths as a light source, the excitation efficiency of the phosphors can be enhanced, and high luminance characteristics can be obtained.

According to this embodiment, the blue LED 110 is mounted directly on the circuit board 140. This chip-on-board method of mounting an LED directly on a circuit board ensures a greater angle of directivity of the LED.

Figure 3:
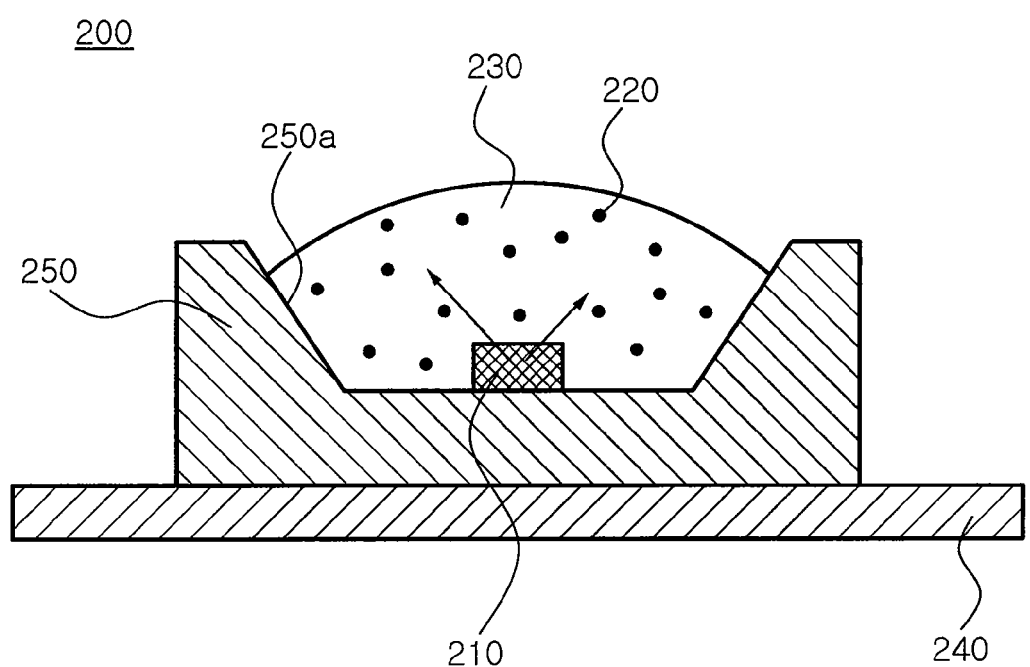
FIG. 3 is a cross-sectional view of a white light emitting device according to another exemplary embodiment of the present invention.

FIG. 3 is a cross-sectional view of a white light emitting device 200 according to another exemplary embodiment of the present invention. Referring to FIG. 3, a white light emitting device 200, according to this embodiment, includes a blue LED 210 disposed on a circuit board 240 and including a plurality of active layers generating different peak wavelengths, and phosphors 220 excited by light emitted from the blue LED 210 to emit yellow light. A package body 250, having a reflective cup 250a, is mounted on the circuit board 240. The blue LED 210 is mounted inside the reflective cup 250a of the package body 250, and a resin encapsulation part 230 containing yellow phosphors 220 encapsulates the blue LED 210. To obtain a surface light source or a line light source with a desired area, a plurality of white light emitting devices, each including the blue LED 210 and the yellow phosphors 220, may be arranged on a substrate. Besides the aforementioned differences from the embodiment of FIG. 2, like terms in the description may be understood as like elements to those of FIG. 2, and thus their description will be omitted.

Embodiment

A white light emitting device using silicate-based phosphors was manufactured, and the emission efficiency thereof was measured.

Figure 4:
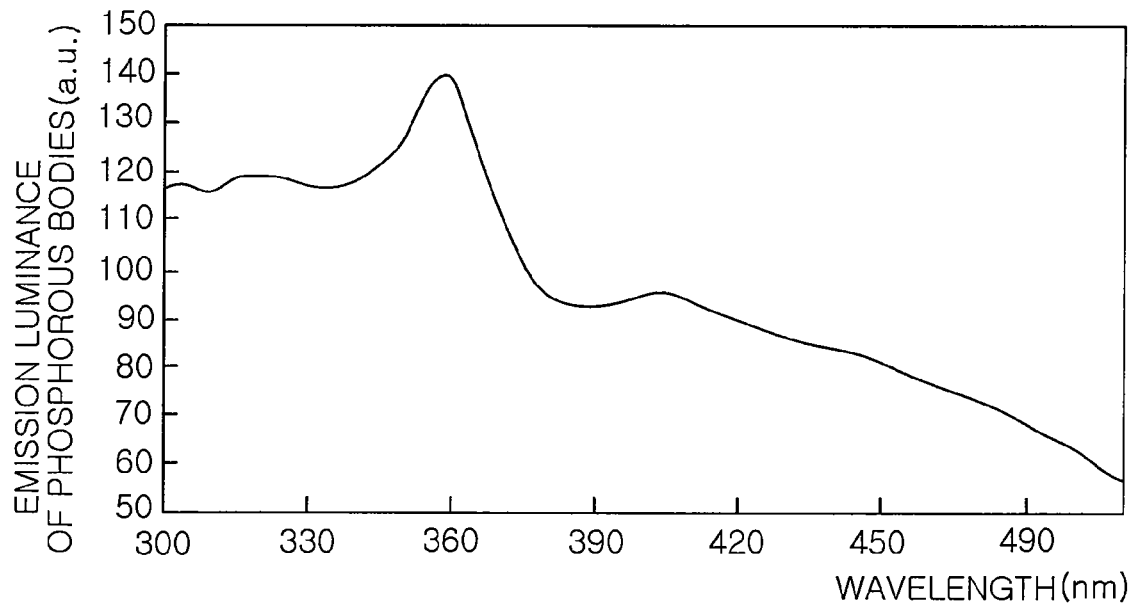
FIG. 4 illustrates an emission spectrum showing the dependence on the excitation wavelength of silicate-based phosphors.
Figure 5:
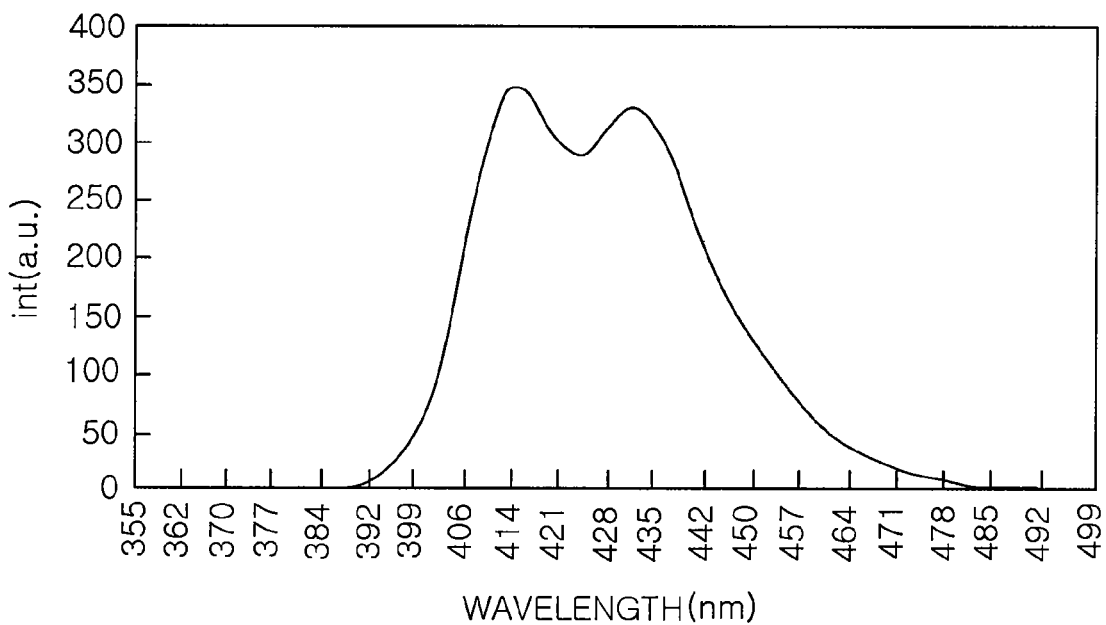
FIG. 5 illustrates the emission spectrum of a blue LED according to an exemplary embodiment of the present invention.

FIG. 4 illustrates an emission spectrum that shows the dependence on the excitation wavelength of the silicate-based phosphors. With reference to the emission spectrum of FIG. 4, blue LEDs were manufactured, each of which emits a short wavelength for the high excitation efficiency of phosphors, and a long wavelength for high visual sensitivity, as shown in Table 1 below. FIG. 5 illustrates the emission spectrum of the blue LED manufactured according to an exemplary embodiment of the present invention. As a comparative example, a blue LED providing a peak wavelength of 440 nm was manufactured. Increases in the ratios of the luminance levels of embodiments were calculated with respect to the light emission efficiency of the comparative example.

As set forth above, according to exemplary embodiments of the invention, light having different peak wavelengths emitted from the blue LED enhances the excitation efficiency of the yellow phosphors, and increases visual sensitivity. Accordingly, the white light emitting device has high luminance by utilizing the blue LED that emits different peak wavelengths, and the yellow phosphors that emit yellow light when excited by the light emitted from the blue LED.

While the present invention has been shown and described in connection with the exemplary embodiments, it will be apparent to those skilled in the art that modifications and variations can be made without departing from the spirit and scope of the invention as defined by the appended claims.

What is claimed is:

1. A white light emitting device comprising:
   a blue light emitting diode (LED) including a plurality of active layers generating different peak wavelengths; and
   phosphors emitting yellow light when excited by light emitted from the blue LED.

2. The white light emitting device of claim 1, wherein the blue LED is a semiconductor light emitting device having a composition represented by $Al_xIn_yGa_{(1-x-y)}N$ where $0 \leq x \leq 1$, $0 \leq y \leq 1$, $0 \leq x+y \leq 1$.

3. The white light emitting device of claim 1, wherein the plurality of active layers each comprise quantum well layers of $In_xGa_{(1-x)}N$ where $0 < x < 1$, and quantum barrier layers of GaN,
   wherein each of the quantum well layers has different In compositions to generate different peak wavelengths.

4. The white light emitting device of claim 1, wherein the plurality of active layers each comprise quantum well layers of $In_xGa_{(1-x)}N$ where $0 < x < 1$, and quantum barrier layers of GaN,
   wherein each of the quantum well layers has different thicknesses to generate different peak wavelengths.

5. The white light emitting device of claim 1, wherein the different peak wavelengths have an interval of 20 nm to 50 nm therebetween.

TABLE 1

| | Emission wavelength of blue LED | Emission intensity of phosphors | Intensity of blue light | Emission intensity | Increase ratio of luminance level |
|---|---|---|---|---|---|
| Comparative example | 440 nm | 727.525 | 0.23921 | 727.76421 | — |
| Embodiment 1 | 410 nm | 628.936 | 0.00797 | 751.17234 | 103.2164442 |
| | 470 nm | 121.989 | 0.23937 | | |
| Embodiment 2 | 400 nm | 638.753 | 0.00279 | 765.83466 | 105.2311517 |
| | 470 nm | 126.830 | 0.24887 | | |
| Embodiment 3 | 400 nm | 523.639 | 0.00229 | 754.71037 | 103.7025948 |
| | 460 nm | 230.823 | 0.24608 | | |
| Embodiment 4 | 410 nm | 517.106 | 0.00655 | 742.3314 | 102.0016359 |
| | 460 nm | 224.979 | 0.23985 | | |
| Embodiment 5 | 400 nm | 378.2322 | 0.00165 | 744.35081 | 102.2791173 |
| | 430 nm | 153.75 | 0.01682 | | |
| | 460 nm | 212.124 | 0.22614 | | |

Embodiments 1 through 4 employ blue LEDs generating blue light having two different peak wavelengths, and embodiment 5 employs a blue LED generating light having three different peak wavelengths. Referring to Table 1, it can be seen that the luminance levels of the embodiments 1 through 5 of the present invention are increased as compared to the comparative example by about 2% to 5%.

6. The white light emitting device of claim 1, wherein the blue LED emits a wavelength ranging from 400 nm to 420 nm and a wavelength ranging from 450 nm to 470 nm as the different peak wavelengths.

7. The white light emitting device of claim 1, wherein the blue LED emits a wavelength ranging from 400 nm to 420 nm, a wavelength ranging from 420 nm to 440 nm, and a wavelength ranging from 440 nm to 460 nm as the different peak wavelengths.

8. The white light emitting device of claim 1, wherein the phosphors are silicate-based phosphors.

9. The white light emitting device of claim 1, wherein the blue LED is mounted directly on a circuit board, the phosphors are included in a resin encapsulation part, and the resin encapsulation part encapsulates the blue LED.

10. The white light emitting device of claim 1, wherein the blue LED is mounted in a package body including a reflective cup, the package body is mounted on a circuit board, the phosphors are included in a resin encapsulation part, and the resin encapsulation part encapsulates the blue LED.

* * * * *